(12) United States Patent
Chang et al.

(10) Patent No.: US 8,518,723 B2
(45) Date of Patent: Aug. 27, 2013

(54) METHOD OF FABRICATING SEMICONDUCTOR INTEGRATED CIRCUIT DEVICE

(75) Inventors: Chong-Kwang Chang, Bucheon-si (KR); Hong-Jae Shin, Seoul (KR); Nae-In Lee, Seoul (KR); Kwang-Hyeon Baik, Suwon-si (KR); Seung-Il Bok, Seoul (KR); Hyo-Jeong Kim, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 947 days.

(21) Appl. No.: 12/591,534

(22) Filed: Nov. 23, 2009

(65) Prior Publication Data

US 2010/0136790 A1 Jun. 3, 2010

(30) Foreign Application Priority Data

Nov. 28, 2008 (KR) ........................ 10-2008-0119907

(51) Int. Cl.
*H01L 21/302* (2006.01)

(52) U.S. Cl.
USPC .............................. 438/17; 438/197; 438/585

(58) Field of Classification Search
None
See application file for complete search history.

(56) References Cited

U.S. PATENT DOCUMENTS

| | | | |
|---|---|---|---|
| 7,005,240 B2 * | 2/2006 | Manger et al. ................. | 430/313 |
| 8,298,943 B1 * | 10/2012 | Arnold et al. ................. | 438/667 |
| 2003/0199169 A1 * | 10/2003 | Jun et al. ........................ | 438/694 |
| 2005/0176193 A1 * | 8/2005 | Kang et al. ..................... | 438/197 |
| 2007/0009840 A1 * | 1/2007 | Kim et al. ....................... | 430/313 |
| 2009/0200583 A1 * | 8/2009 | Marokkey et al. ............. | 257/288 |
| 2010/0167502 A1 * | 7/2010 | Yen et al. ........................ | 438/478 |

FOREIGN PATENT DOCUMENTS

| | | |
|---|---|---|
| KR | 10-2003-0080320 A | 10/2003 |
| KR | 10-2005-0075462 A | 7/2005 |
| KR | 10-2007-0005787 A | 1/2007 |

OTHER PUBLICATIONS

Hidetami Yaegashi, Robust material and processes for Double Patterning, Oct. 2009, 6th International Symposium on Immersion Lithography Extensions, p. 1-19.*
KIPO, English Abstract KR 10-2003-0080320A, 2004.
Kipo, English Abstract KR 10-2005-0075462A, 2006.
Kipo, English Abstract KR 10-2007-0005787A, 2007.

* cited by examiner

*Primary Examiner* — Binh X Tran
*Assistant Examiner* — David Cathey, Jr.
(74) *Attorney, Agent, or Firm* — Lee & Morse, P.C.

(57) ABSTRACT

A method of fabricating a semiconductor integrated circuit device, including providing a semiconductor substrate, sequentially forming an etching target layer and a hard mask layer on the semiconductor substrate, forming first etch masks on the hard mask layer, the first etch masks including a plurality of first line patterns spaced apart from one another at a first pitch and extending in a first direction, forming first hard mask patterns by etching the hard mask layer using the first etch masks, forming second etch masks on the first hard mask patterns, the second etch masks including a plurality of second line patterns spaced apart from one another at a second pitch and extending in a second direction different from the first direction, forming second hard mask patterns by etching the first hard mask patterns using the second etch masks, forming spacers on sidewalls of the second hard mask patterns, and patterning the etching target layer using the second hard mask patterns having the spacers.

13 Claims, 8 Drawing Sheets

METHOD OF FABRICATING SEMICONDUCTOR INTEGRATED CIRCUIT DEVICE

BACKGROUND

1. Field of the Invention

Embodiments relate to a method of fabricating a semiconductor integrated circuit device.

2. Description of the Related Art

Due to the higher degrees of integration of semiconductor integrated circuit devices, the trend of gradually reducing a design rule is evident. Accordingly, forming smaller patterns has become crucial to meet the trend of reducing the design rule. In this regard, however, the reduction in the design rule may make it difficult to control a spatial margin between gates during fabrication of the semiconductor integrated circuit devices.

SUMMARY

Embodiments are directed to a method of fabricating a semiconductor integrated circuit device, which substantially overcomes one or more of the problems due to the limitations and disadvantages of the related art.

It is a feature of an embodiment to provide a method of fabricating a semiconductor integrated circuit device having improved reliability.

At least one of the above and other features and advantages may be realized by providing a method of fabricating a semiconductor integrated circuit device including providing a semiconductor substrate, sequentially forming an etching target layer and a hard mask layer on the semiconductor substrate, forming first etch masks on the hard mask layer, the first etch masks including a plurality of first line patterns spaced apart from one another at a first pitch and extending in a first direction, forming first hard mask patterns by etching the hard mask layer using the first etch masks, forming second etch masks on the first hard mask patterns, the second etch masks including a plurality of second line patterns spaced apart from one another at a second pitch and extending in a second direction different from the first direction, forming second hard mask patterns by etching the first hard mask patterns using the second etch masks, forming spacers on sidewalls of the second hard mask patterns, and patterning the etching target layer using the second hard mask patterns having the spacers.

The etching target layer may be a polysilicon layer.

The spacers may be formed of the same material as the hard mask layer.

The spacers may be low-temperature oxide layers.

The forming the spacers may include adjusting sizes of the patterned etching target layers by adjusting thicknesses of the spacers.

The method may further include forming line spacers on sidewalls of the first mask patterns prior to forming the second etch masks.

The forming the second hard mask patterns may include forming a plurality of rectangular patterns spaced apart from one another in the first and second directions.

The method may include reducing a line edge roughness of the second hard mask patterns by way of the spacers.

At least one of the above and other features and advantages may also be realized by providing a method of fabricating a semiconductor integrated circuit device including providing a semiconductor substrate, sequentially forming an etching target layer and a hard mask layer on the semiconductor substrate, forming first etch masks on the hard mask layer, the first etch masks including a plurality of first line patterns spaced apart from one another at a first pitch and extending in a first direction, forming first hard mask patterns by etching the hard mask layer using the first etch masks, forming line spacers on sidewalls of the first mask patterns, forming second etch masks on the first hard mask patterns having the line spacers, the second etch masks including a plurality of second line patterns spaced apart from one another at a second pitch and extending in a second direction different from the first direction, forming second hard mask patterns by etching the first hard mask patterns using the second etch masks, and patterning the etching target layer using the second hard mask patterns.

The etching target layer may be a polysilicon layer.

The line spacers may be formed of the same material as the hard mask layer.

The line spacers may be low-temperature oxide layers.

The method may include reducing a line edge roughness of the first hard mask patterns by way of the line spacers.

BRIEF DESCRIPTION OF THE DRAWINGS

The above and other features and advantages will become more apparent to those of ordinary skill in the art by describing in detail exemplary embodiments with reference to the attached drawings, in which:

FIGS. 2B through 3 illustrate cross-sectional views of stages in a method of fabricating a semiconductor integrated circuit device taken along lines I-I' and II-II' of FIG. 2A;

FIGS. 4B through 6 illustrate cross-sectional views of stages in a method of fabricating a semiconductor integrated circuit device taken along lines I-I', II-II', and III-III' of FIG. 4A;

FIGS. 7B through 8 illustrate cross-sectional views of stages in a method of fabricating a semiconductor integrated circuit device taken along lines I-I', II-II', and III-III' of FIG. 4A;

DETAILED DESCRIPTION

Korean Patent Application No. 10-2008-0119907 filed on Nov. 28, 2008 in the Korean Intellectual Property Office, and entitled: "Fabricating Method of Semiconductor Integrated Circuit Devices," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, unless otherwise explicitly indicated, when an element or layer is referred to as being "connected to" or "coupled to" another element or layer, it can be directly connected or coupled to the other element or layer or intervening elements or layers may be present. As used herein, the term "and/or" includes any and all combinations of one or more of the associated listed items.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

It will be understood that the spatially relative terms are intended to encompass different orientations of the device in use or operation in addition to the orientation depicted in the figures. Like numbers refer to like elements throughout.

Exemplary embodiments are described herein with reference to cross-section illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Figure 1:
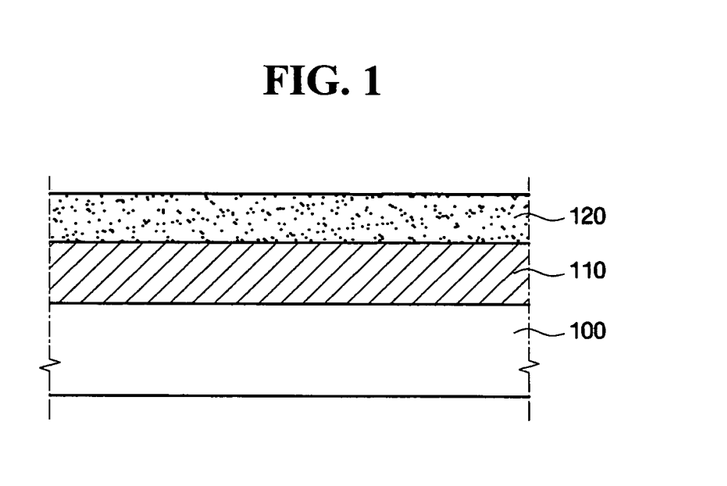
FIG. 1 illustrates a cross-sectional view of a stage in a method of fabricating a semiconductor integrated circuit device according to an embodiment.
Figure 2A:
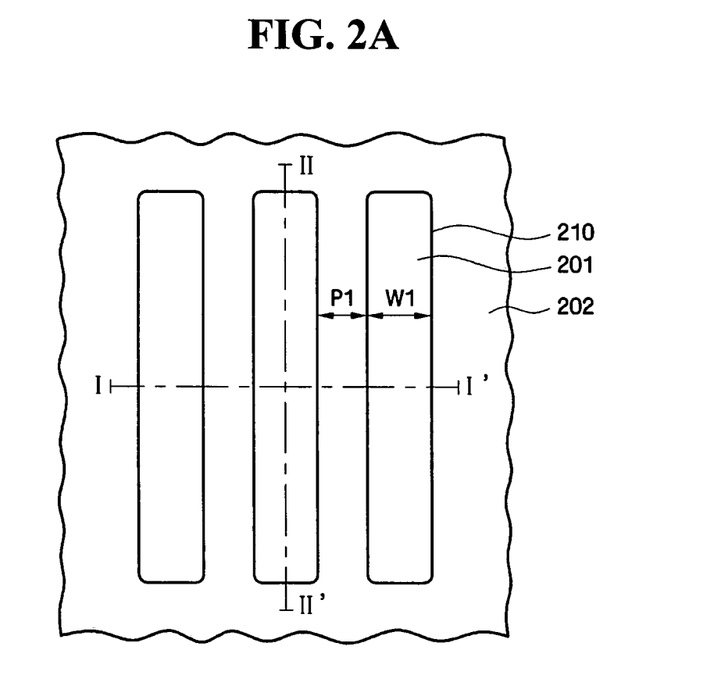
FIG. 2A illustrates a conceptual diagram of a stage in a method of forming first etch masks according to an embodiment.
Figure 2B:
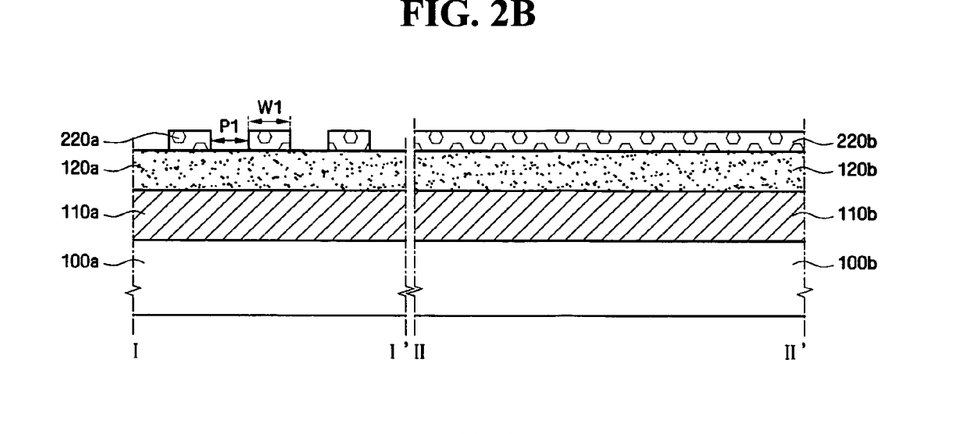
Figure 3:
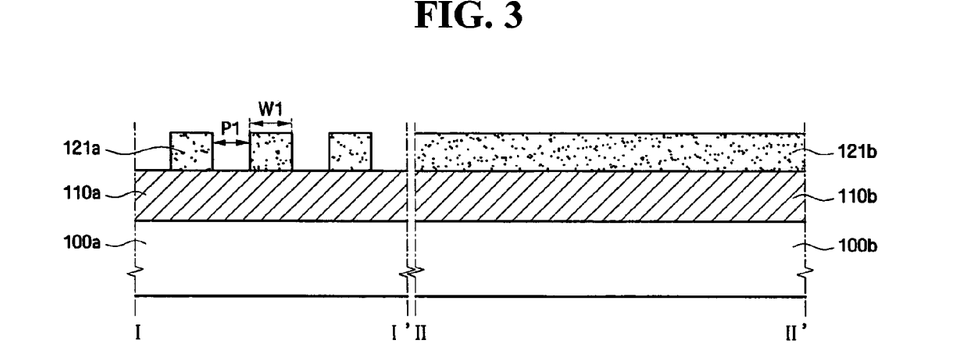
Figure 4A:
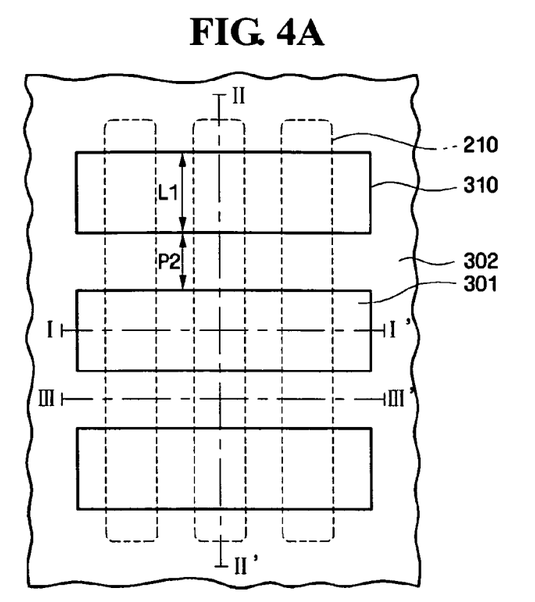
FIG. 4A illustrates a conceptual diagram of a stage in a method of forming second etch masks according to an embodiment.
Figure 7A:
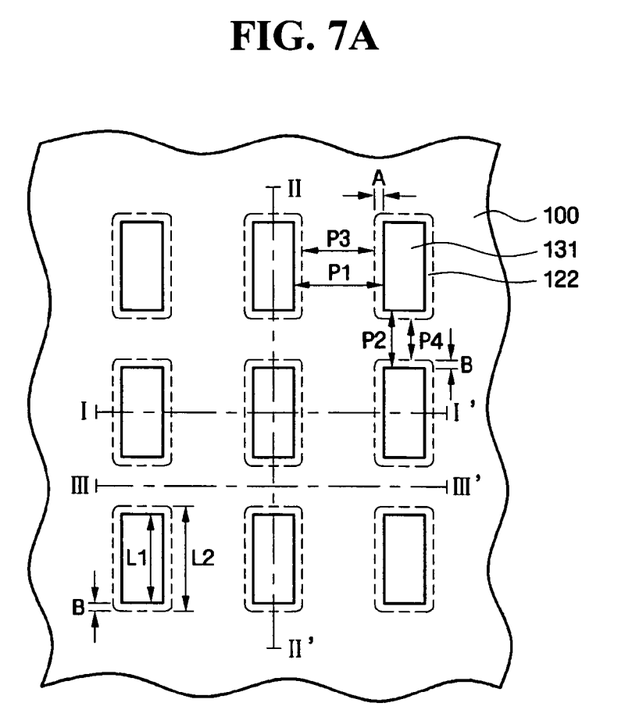
FIG. 7A illustrates a conceptual diagram of a stage in a method of forming second hard mask patterns including spacers according to an embodiment.
Figure 7B:
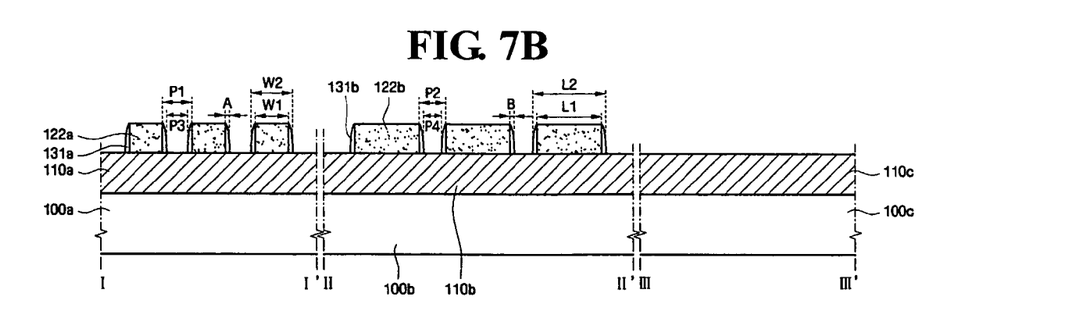
Figure 8:
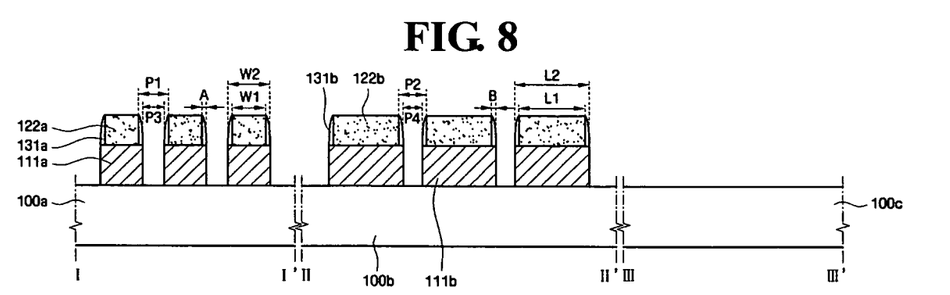
Figure 9:
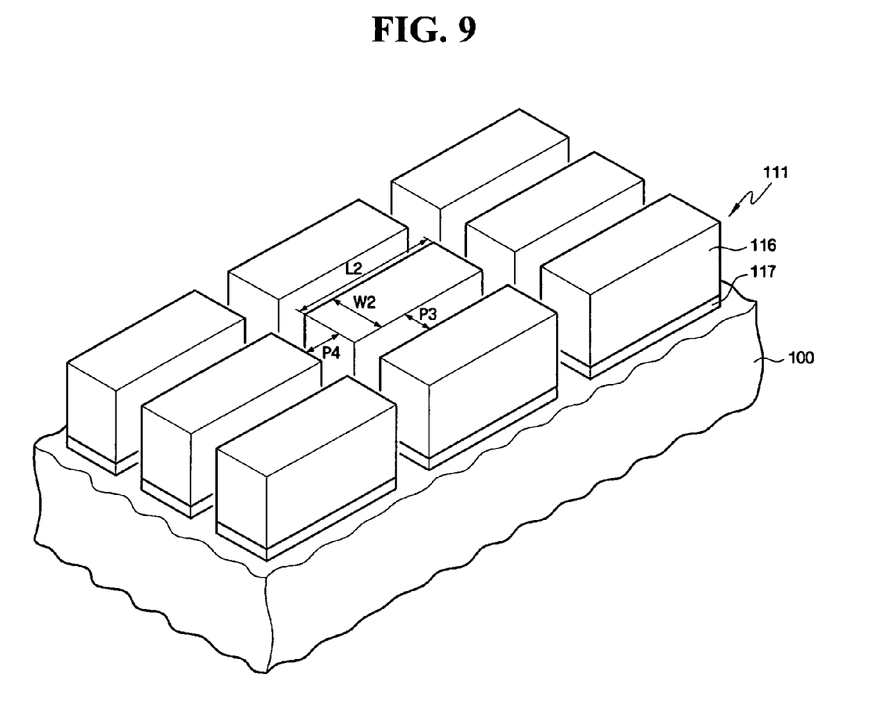
FIG. 9 illustrates a perspective view of gate patterns manufactured by a method of fabricating a semiconductor integrated circuit device according to an embodiment.

Hereinafter, a method of fabricating a semiconductor integrated circuit device according to an embodiment will be described with reference to FIGS. 1 through 9. FIG. 1 illustrates a cross-sectional view of a stage in a method of fabricating a semiconductor integrated circuit device according to an embodiment. FIG. 2A illustrates a conceptual diagram of a stage in a method of forming first etch masks according to an embodiment. FIGS. 2B through 3 illustrate cross-sectional views of stages in a method of fabricating a semiconductor integrated circuit device taken along lines I-I' and II-II' of FIG. 2A. FIG. 4A illustrates a conceptual diagram of a stage in a method of forming second etch masks according to an embodiment. FIGS. 4B through 6 illustrate cross-sectional views of stages in a method of fabricating a semiconductor integrated circuit device taken along lines I-I', II-II', and III-III' of FIG. 4A. FIG. 7A illustrates a conceptual diagram of a stage in a method of forming second hard mask patterns including spacers according to an embodiment. FIGS. 7B through 8 illustrate cross-sectional views of stages in a method of fabricating a semiconductor integrated circuit device taken along lines I-I', II-II', and III-III' of FIG. 4A. FIG. 9 illustrates a perspective view of gate patterns manufactured by a method of fabricating a semiconductor integrated circuit device according to an embodiments.

Referring to FIG. 1, a semiconductor substrate 100 may be provided. The semiconductor substrate 100 may include, e.g., Si, Ge, SiGe, GaP, GaAs, SiC, SiGeC, InAs, InP, an SOI (Silicon On Insulator) substrate, or the like. Then, an etching target layer 110 and a hard mask layer 120 may be sequentially formed on the semiconductor substrate 100.

The etching target layer 110 may be formed on the semiconductor substrate 100, and may be, e.g., a polysilicon layer. The etching target layer 110 may be formed by a deposition process, e.g., a chemical vapor deposition (CVD) process.

The hard mask layer 120 may be formed on the etching target layer 110. The hard mask layer 120 may include, e.g., a TEOS layer and/or a spin-on mask layer. The TEOS layer and the spin-on mask layer may be formed by any suitable technique known in the art.

Referring to FIGS. 2A and 2B, first etch masks 220a and 220b may define a plurality of first line patterns 210. The first line patterns 210 may be spaced apart from one another at a first pitch P1 on the semiconductor substrates 100a and 100b, and may extend in a first direction.

In particular, an etch mask material may be applied to the semiconductor substrates 100a and 100b having etching target layers 110a and 110b and hard mask layers 120a and 120b thereon. Then, a photolithographic etching process may be performed on the resultant semiconductor substrates 100a and 100b, thereby forming first etch masks 220a and 220b. The etch mask material may include, e.g., photoresist.

As illustrated in FIG. 2A, when performing the photolithographic etching process, the etch mask material may be selectively removed using a first exposure mask. The first exposure mask may include a plurality of first exposure patterns corresponding to the plurality of first line patterns 210 of the first etch masks 220a and 220b to be formed on the hard mask layers 120a and 120b. The plurality of first exposure patterns may have an exposure pitch and an exposure width corresponding to a first pitch P1 and a first width W1 of the first line patterns 210.

The first exposure mask may include a first region 201 where the plurality of first line patterns 210 are formed and a second region 202 corresponding to regions other than the first region 201. The plurality of first exposure patterns may define the first region 201 and the second region 202. For example, when using positive photoresist as an etch mask material, by which an area that is exposed to light is removed during a developing step, the first region 201 may be a light-blocking area and the second region 202 may be a light-transmitting area. Conversely, when using negative photoresist as an etch mask material, in which an area that is not exposed to light is removed during a developing step, the first region 201 may be a light-transmitting area and the second region 202 may be a light-blocking area.

The photolithographic etching process may be performed using the first exposure mask, thereby forming the first etch mask 220a defining the plurality of first line patterns 210, as illustrated in the left portion of FIG. 2B. The plurality of first line patterns 210 may be spaced apart from one another at a first pitch P1, may have a first width W1, and may extend in a first direction. The exposure pitch and the exposure width of the plurality of first exposure patterns defined by the first exposure mask may be adjusted, thereby adjusting the first pitch P1 and the first width W1 of the first etch mask 220a.

Referring to the right portion of FIG. 2B, the etching target layer 110b, the hard mask layer 120b, and the first etch mask 220b may be sequentially stacked on the semiconductor substrate 100b. Since the plurality of first line patterns 210 may extend in the first direction, as illustrated in FIG. 2A, portions of the first etch mask 220b may remain on the structure.

Referring to FIG. 3, the hard mask layers 120a and 120b may be etched using the first etch masks (220a and 220b of FIG. 2B) to form the first hard mask patterns 121a and 121b. In particular, the first hard mask layers 120a and 120b may be subjected to an etching process using the first etch masks 220a and 220b. The etching process may be, e.g., an anisotropic etching process.

Referring to FIG. 3 and the left portion of FIG. 2B, because portions of the hard mask layer 120a may be removed using the first etch mask 220a, the first hard mask patterns 121a may correspond to the first pitch P1 and the first width W1 of each of the plurality of first line patterns 210 of the first etch mask 220a.

Although not shown, when the etching process is performed using the exposure mask, an edge line of an etched portion of the first hard mask patterns 121a and 121b may become very rough, which is referred to as a line edge roughness (LER) phenomenon. In particular, as the pitch and width of a pattern decrease, the extent of the undesirable LER may increase. For example, as each of the plurality of first line patterns 210 decreases in pitch and/or width, the first hard mask patterns 121a and 121b may have an undesirable non-uniform line edge.

In order to reduce LER of the first hard mask patterns 121a and 121b, line spacers may be formed on sidewalls of the first hard mask patterns 121a and 121b. In particular, line spacer layers may be formed on the semiconductor substrates 100a and 100b having the first hard mask patterns 121a and 121b thereon. The line spacer layers may be anisotropically etched to form line spacers on sidewalls of the first hard mask patterns 121a and 121b, which will be described below in further detail with reference to FIGS. 10 through 11B.

Figure 4B:
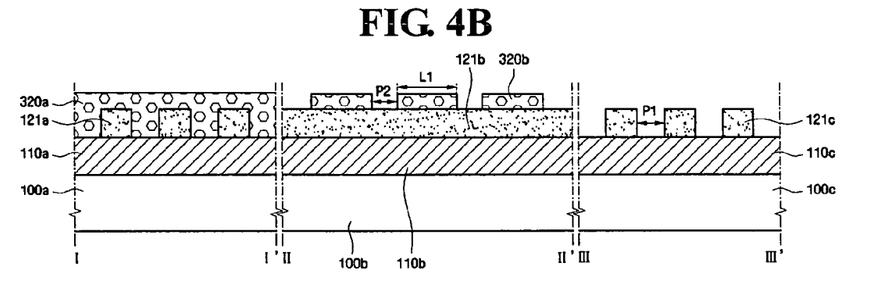

Referring to FIGS. 4A and 4B, second etch masks 320a and 320b defining a plurality of second line patterns 310 may be formed on the first hard mask patterns (121a and 121b of FIG. 3), may be spaced apart from one another at a second pitch P2, and may extend in a second direction different from the first direction. In particular, an etch mask material, e.g., photoresist, may be applied to the semiconductor substrates 100a, 100b, and 100c having the first hard mask patterns 121a, 121b and 121c thereon. Then, a photolithographic etching process may be performed, thereby forming the second etch masks 320a and 320b.

As illustrated in FIG. 4A, the forming of the second etch masks 320a and 320b may be done by selectively removing the etch mask material through the photolithographic etching process using a second exposure mask in the same manner as the forming of the first etch masks (220a and 220b of FIG. 2B). The second exposure mask may also have an exposure pitch corresponding to the second pitch P2 of the plurality of second line patterns 310 in the second etch masks 320a and 320b, and an exposure length corresponding to a first length L1.

The second exposure mask may include a first region 301 where the plurality of second line patterns 310 are formed, and a second region 302 other than the first region 301. For example, when using positive photoresist, the first region 301 may be a light-blocking area and the second region 302 may be a light-transmitting area.

The photolithographic etching process may be performed using the second exposure mask, thereby forming the second etch masks 320a and 320b defining the plurality of second line patterns 310, as illustrated in FIG. 4B. The plurality of second line patterns 310 may be spaced apart from one another at the second pitch P2, may have a first length L1, and may extend in the second direction. In an implementation, the second direction may be perpendicular to the first direction. The second pitch P2 and the first length L1 of the second etch masks 320a and 320b may be adjusted by controlling the exposure pitch and exposure length of each of the plurality of second exposure patterns of the second exposure mask. In the case of forming the second etch masks 320a and 320b, defining the plurality of second line patterns 310 on the first etch masks 220a and 220b defining the plurality of first line patterns 210, an arrangement relationship between the first etch masks 220a and 220b and the second etch masks 320a and 320b is illustrated in FIG. 4B.

In particular, when an intermediate structure is sectioned and viewed along the line I-I' of FIG. 4A, as illustrated in the left portion of FIG. 4B, the second etch mask 320a may be formed on the first hard mask patterns 121a and may fill spaced-apart portions between each of the first hard mask patterns 121a.

When the intermediate structure is sectioned and viewed along the line II-II' of FIG. 4A, as illustrated in the middle portion of FIG. 4B, the second etch mask 320b having the first length L1 may be formed on the first hard mask patterns 121b and spaced apart from one another at the second pitch P2.

When the intermediate structure is sectioned and viewed along the line III-III' of FIG. 4A, as illustrated in the right portion of FIG. 4B, the first hard mask patterns 121c spaced apart from one another at the first pitch P1 may be exposed. For example, when using positive photoresist, an etch mask material corresponding to a light-transmitting area of the second exposure mask may be removed to expose the first hard mask patterns 121c.

Figure 5:
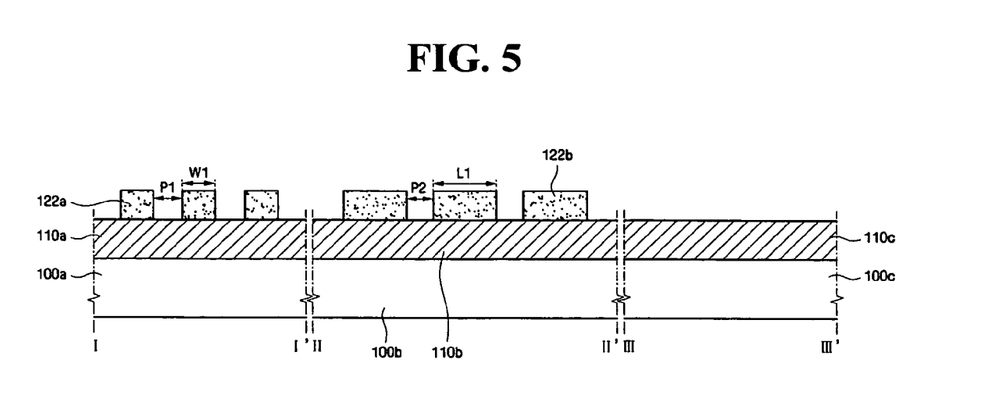

Referring to FIG. 5, portions of the first hard mask patterns (121a, 121b, and 121c of FIG. 4B) may be etched using the second etch masks (320a and 320b of FIG. 4B), thereby forming second hard mask patterns 122a and 122b. In particular, portions of the first hard mask patterns (121a, 121b, and 121c of FIG. 4B) may be etched by, e.g., anisotropic etching, using the second etch masks 320a and 320b. As illustrated in the left portion of FIG. 5, portions of the first hard mask patterns 121a in the second region may not be etched away due to the presence of the second etch mask 320a, forming second hard mask patterns 122a having the first pitch P1 and the first width W1 may remain.

As illustrated in the middle portion of FIG. 5, portions of the first hard mask patterns 121b may be etched using the second etch mask 320b, thereby forming the second hard mask patterns 122b corresponding to the second etch mask 320b having the second pitch P2 and the first length L1.

As illustrated in the right portion of FIG. 5, the first hard mask patterns 121c exposed by openings between each of the plurality of second line patterns 310 of the second etch mask 320c may be removed by the etching process. Accordingly, no first hard mask patterns may remain on portions of the etching target layer 110c.

As described above, the first etch masks 220a and 220b may be spaced apart from one another at the first pitch P1 and may extend in the first direction. The second etch masks 320a and 320b may be spaced apart from one another at the second pitch P2 and may extend in the second direction. Accordingly, when forming the second etch masks 320a and 320b, the first hard mask patterns 121a, 121b, and 121c formed using the first etch masks 220a and 220b may intersect the second etch masks 320a and 320b. In other words, among the first hard mask patterns 121a, 121b, and 121c intersecting the second etch masks 320a and 320b, portions of the first hard mask patterns 121a, 121b, and 121c exposed by openings between each of the second line patterns 310 of the second etch masks 320a and 320b may be removed by the etching process.

Thus, the second hard mask patterns 122a and 122b may be formed, the second hard mask patterns 122a and 122b being spaced apart from one another at the first pitch P1 and having the first width W1 in the first direction, while being spaced apart at the second pitch P2 and having the first length L1 in the second direction. Here, the first width W1 may be different from the first length L1. In an implementation, the length L1 may be greater than the width W1. Thus, the second hard mask patterns 122a and 122b may be formed in multiple rectangular patterns spaced apart from one another in the first and second directions.

Figure 6:
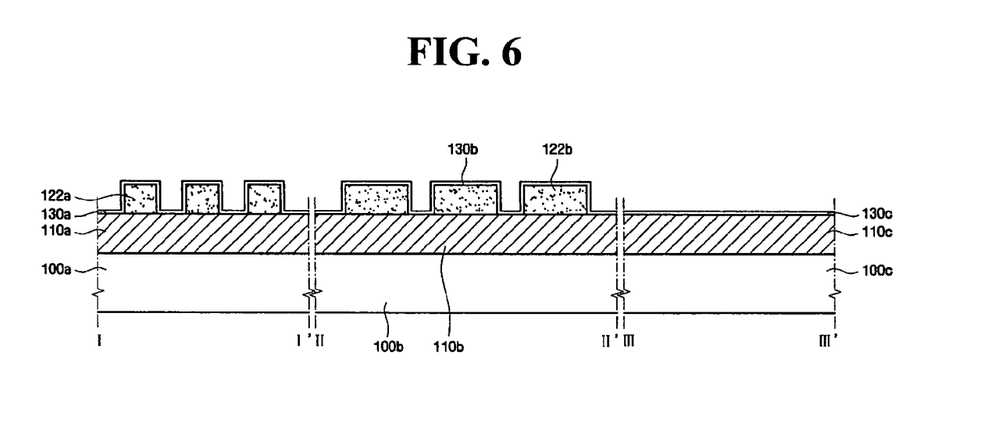

Referring to FIG. 6, spacer layers 130a, 130b, and 130c may be conformally formed on the semiconductor substrates 100a, 100b, and 100c having the second hard mask patterns 122a and 122b thereon. Here, the spacer layers 130a, 130b, and 130c may be formed by, e.g., a low-temperature oxide layer formation technique. Accordingly, the spacer layers 130a, 130b, and 130c may be, e.g., low-temperature oxide layers. In addition, the spacer layers 130a, 130b, and 130c may be formed of the same material as the hard mask layers 120a, 120b, and 120c. The low-temperature oxide layers may exhibit better LER reducing properties, compared to polymer layers. For example, when using low-temperature oxide layers as the spacer layers 130a, 130b, and 130c, the spacer layers 130a, 130b, and 130c may provide more suitable features as spacers in view of selectivity.

Thicknesses of the spacer layers 130a, 130b, and 130c may be determined by adjusting processing conditions, e.g., a processing time, etc., during formation of the spacer layers 130a, 130b, and 130c, which will now be described in more detail.

Referring to FIGS. 7A and 7B, sidewall spacers, i.e., spacers 131a and 131b, may be formed on sidewalls of the second hard mask patterns 122a and 122b. For example, the spacer layers 130a, 130b, and 130c may be anisotropically etched, such that portions of the spacer layers 130a, 130b, and 130c remain on the sidewalls of the second hard mask patterns 122a and 122b, thereby forming the spacers 131a and 131b.

As illustrated in FIG. 7A, spacers 131 may surround the sidewalls of second hard mask patterns 122. For example, when the second hard mask patterns 122 include a plurality of rectangular patterns, a third pitch P3 between the spacers 131 of adjacent hardmask patterns in the second direction may be determined by a thickness A of the spacers 131. Similarly, a fourth pitch P4 of the spacers 131 of adjacent hardmask patterns in the first direction may be determined by a thickness B of the spacers 131.

As illustrated in the left portion of FIG. 7B, in the second direction, the third pitch P3 of the second hard mask patterns 122a having the spacers 131a thereon may be reduced by the cumulative thicknesses A of each set of adjoining spacers 131a, compared to the first pitch P1 of the second hard mask patterns 122a not having the spacers 131a.

In the same manner, as illustrated in the middle portion of FIG. 7B, in the first direction, the fourth pitch P4 of the second hard mask patterns 122b having the spacers 131b thereon may be reduced by the cumulative thicknesses B of each set of adjoining spacers 131b, compared to the second pitch P2 of the second hard mask patterns 122b not having the spacers 131b.

As illustrated in the right portion of FIG. 7B, no second hard mask pattern may remain at intersection areas of an opening between each of the first etch masks and an opening between each of the second etch masks. Accordingly, portions of the spacer layer 130c on the etching target layer 110c may be removed by the etching process.

The thicknesses A and B of the spacers 131a and 131b may increase an effective width and length of each of the second hard mask patterns 122a and 122b. Thus, the etching target layers 110a, 110b, and 110c may be patterned using the width W2 and length L2 of each of the second hard mask patterns 122a and 122b having the spacers 131a and 131b thereon.

After the spacer layers 130a, 130b, and 130c are etched to form spacers 131 on the sidewalls of the second hard mask patterns 122a and 122b, the etching target layers 110a, 110b, and 110c may be patterned using the second hard mask patterns 122a and 122b having the spacers 131a and 131b thereon. Accordingly, adjusting the thicknesses of the spacer layers 130a, 130b, and 130c may increase the effective sizes of the second hard mask patterns 122a and 122b. In an implementation, the thicknesses of each of the spacer layers 130a, 130b, and 130c are denoted by different reference symbols according to the direction. Thus, "A" represents the thickness in the first direction and "B" represents the thickness in the second direction. In another implementation, however, the thicknesses of the spacer layers 130a, 130b, and 130c may be different from or the same as each other by various determining factors.

Next, referring to FIGS. 8 and 9, the etching target layers 110a, 110b, and 110c may be patterned using the second hard mask patterns 122a and 122b having the spacers 131a and 131b thereon. In particular, the etching target layers 110a, 110b, and 110c may be anisotropically etched using the second hard mask patterns 122a and 122b having the spacers 131a and 131b thereon as etch masks.

As illustrated in FIG. 8, the etching target layers 110a, 110b, and 110c may be etched by the anisotropic etching process so as to be aligned with the second hard mask patterns 122a and 122b having the spacers 131a and 131b thereon, thereby forming etching target patterns 111a and 111b. Since the etching target patterns 111a and 111b may be aligned with sidewalls of the spacers 131a and 131b, they may correspond to the second hard mask patterns 122a and 122b having the spacers 131a and 131b thereon.

In particular, as illustrated in the left portion of FIG. 8, etching target patterns 111a may be spaced apart from adjacent etching target patterns 111a in the second direction at the third pitch P3 corresponding to the second hard mask patterns 122a having the spacers 131a thereon. In addition, each of etching target patterns 111a may have a second width W2 corresponding to the sum (i.e., W1+2A) of the first width W1 of each of the second hard mask patterns 122a and twice the thickness A of the spacers 131a thereon.

Similarly, as illustrated in the middle portion of FIG. 8, etching target patterns 111b may be spaced apart from adjacent etching target patterns 111b in the first direction at the fourth pitch P4 corresponding to the second hard mask patterns 122*b* having the spacers 131*b* thereon. In addition, each of the etching target patterns 111*b* may have a second length L2 corresponding to the sum (i.e., L1+2B) of the first length L1 of each of the second hard mask patterns 122*b* and twice the thickness B of the spacers 131*b* thereon.

As illustrated in FIG. 9, the etching target pattern 111 may include, e.g., a plurality of rectangular patterns. Each of the plurality of rectangular patterns may include a gate insulating layer 117 and a gate conducting layer 116.

The plurality of rectangular patterns may be spaced apart from one another at the third pitch P3 in the second direction and at the fourth pitch P4 in the first direction. As described above, each of the plurality of rectangular patterns may have the second width W2 and the second length L2.

Although not illustrated, semiconductor integrated circuit devices may be fabricated by performing subsequent processes, which are widely known in the art and a detailed explanation thereof is omitted.

In the method of fabricating a semiconductor integrated circuit device according to an embodiment, etching target layers may be patterned using hard mask patterns having spacers thereon. Thicknesses of the spacers may be adjusted, thereby determining overall effective sizes of the hard mask patterns. In other words, a pitch between the etching target patterns may be advantageously controlled by adjusting the thickness of the spacers. In addition, a low-temperature oxide layer may be used as a spacer layer, thereby conformally forming the spacer layer on the hard mask patterns. Further, surface tension characteristics exhibited by the low-temperature oxide layer may beneficially reduce the extent of LER of the hard mask patterns.

Hereinafter, a method of fabricating a semiconductor integrated circuit device according to another embodiment will be described with reference to FIGS. 10 through 11B. The method of fabricating the semiconductor integrated circuit device according the present embodiment is different from the previous embodiment in that after forming first hard mask patterns, line spacers may be formed on sidewalls of the first hard mask patterns.

Figure 10:
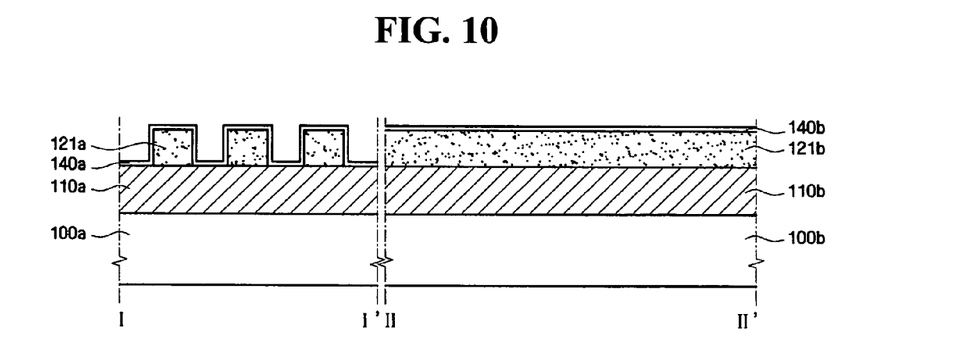
FIG. 10 illustrates a cross-sectional view of a stage in a method of fabricating a semiconductor integrated circuit device taken along lines I-I', II-II', and III-III' of FIG. 7A.
Figure 11A:
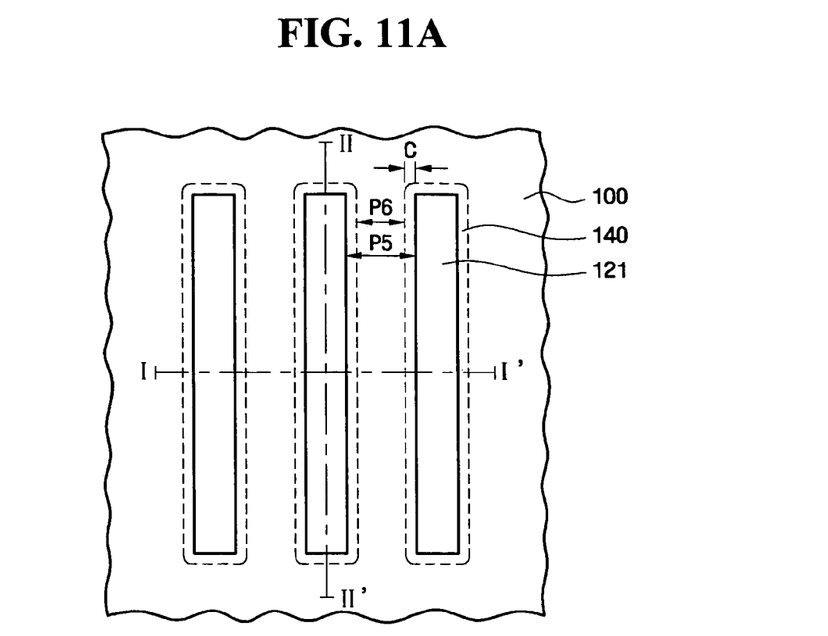
FIG. 11A illustrates a conceptual diagram of a stage in a method of forming line spacers according to another embodiment.

FIG. 10 illustrates a cross-sectional view of a semiconductor integrated circuit device taken along lines I-I' and II-II' of FIG. 7A. FIG. 11A illustrates a conceptual diagram of a stage in a method of forming line spacers according to an embodiment. FIG. 11B illustrates a cross-sectional view of a stage in a method of fabricating a semiconductor integrated circuit device taken along lines I-I' and II-II' of FIG. 11A. The same reference numerals are used for identical components in FIGS. 1 through 11B, and detailed descriptions of the corresponding components will be omitted or only briefly made.

In the following description, processing steps subsequent to the step of forming a first hard mask pattern will be described. In other words, the processing steps following the steps illustrated in FIG. 3 will now be described.

Referring to FIG. 10, line spacer layers 140*a* and 140*b* may be formed on the semiconductor substrate 100 having the first hard mask patterns 121*a* and 121*b* thereon. In particular, the line spacer layers 140*a* and 140*b* may be formed by, e.g., a low-temperature oxide layer formation technique. Accordingly, the line spacer layers 140*a* and 140*b* may be low-temperature oxide layers.

Figure 11B:
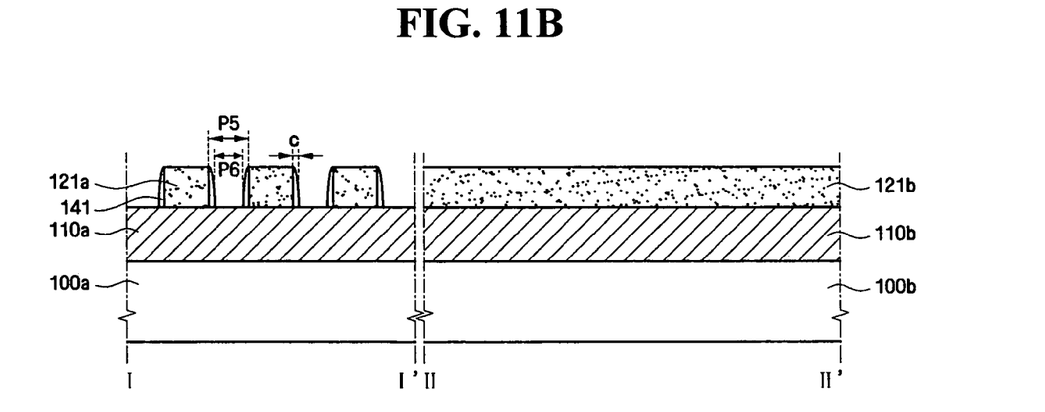
FIG. 11B illustrates a cross-sectional view a stage in a method of fabricating a semiconductor integrated circuit device taken along lines I-I' and II-II' of FIG. 11A.

Next, referring to FIGS. 11A and 11B, the line spacer layers 140*a* and 140*b* may be etched to form line spacers 141*a* and 141*b* on sidewalls of the first hard mask patterns 121*a* and 121*b*. In particular, the etching of the line spacer layers 140*a* and 140*b* may include anisotropically etching the semiconductor substrates 100*a* and 100*b* having the line spacer layers 140*a* and 140*b* thereon.

As described above, as a distance between each of the plurality of first line patterns is decreased, a line edge roughness (LER) phenomenon may affect the first hard mask patterns 121*a* and 121*b*. However, when forming the line spacer layers 140*a* and 140*b* using the low-temperature oxide layers, LER may be reduced due to, e.g., surface tension. In other words, a rough edge line of sidewalls of the first hard mask patterns 121*a* and 121*b* may be beneficially reduced by forming the line spacers 141*a* and 141*b* on the sidewalls of the first hard mask patterns 121*a* and 121*b*.

Although not illustrated, the fabrication method according to the present embodiment may be achieved by performing subsequent processes, which are substantially the same as those of the previous embodiment. In particular, second hard mask patterns may be formed by forming second etch masks having a plurality of second line patterns spaced apart from one another at a second pitch on the first hard mask patterns 121*a* and 121*b* having the line spacers 141*a* and 141*b* thereon, and extending in the second direction different from the first direction, and etching the first hard mask patterns using the second etch masks.

However, the fabrication method according to the present embodiment is different from the previous embodiment in that after forming the second hard mask patterns, an etching target layer may be patterned using the second hard mask patterns with no additional spacers.

In the method of fabricating the semiconductor integrated circuit device according to the present embodiment, the first hard mask patterns having line spacers may be formed. Accordingly, even if the distance between each of the plurality of first line patterns is reduced, the first hard mask patterns having reduced LER may be formed. In addition, since the line spacers may be formed using low-temperature oxide layers, they may be conformally formed on the hard mask patterns. Further, the extent of LER of the first hard mask patterns may be reduced by surface tension characteristics exhibited by the low-temperature oxide layers.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor integrated circuit device, comprising:

providing a semiconductor substrate;

sequentially forming an etching target layer and a hard mask layer on the semiconductor substrate;

forming first etch masks on the hard mask layer, the first etch masks including a plurality of first line patterns spaced apart from one another at a first pitch and extending in a first direction;

forming first hard mask patterns by etching the hard mask layer using the first etch masks;

forming second etch masks on the first hard mask patterns, the second etch masks including a plurality of second line patterns spaced apart from one another at a second pitch and extending in a second direction different from the first direction;

forming second hard mask patterns by etching the first hard mask patterns using the second etch masks;

forming spacers on sidewalls of the second hard mask patterns; and patterning the etching target layer using the second hard mask patterns having the spacers.

2. The method as claimed in claim 1, wherein the etching target layer is a polysilicon layer.

3. The method as claimed in claim 1, wherein the spacers are formed of the same material as the hard mask layer.

4. The method as claimed in claim 1, wherein the spacers are low-temperature oxide layers.

5. The method as claimed in claim 1, wherein the forming the spacers includes adjusting sizes of the patterned etching target layers by adjusting thicknesses of the spacers.

6. The method as claimed in claim 1, further comprising forming line spacers on sidewalls of the first mask patterns prior to forming the second etch masks.

7. The method as claimed in claim 1, wherein forming the second hard mask patterns includes forming a plurality of rectangular patterns spaced apart from one another in the first and second directions.

8. The method as claimed in claim 1, including reducing a line edge roughness of the second hard mask patterns by way of the spacers.

9. A method of fabricating a semiconductor integrated circuit device, comprising:
  providing a semiconductor substrate;
  sequentially forming an etching target layer and a hard mask layer on the semiconductor substrate;
  forming first etch masks on the hard mask layer, the first etch masks including a plurality of first line patterns spaced apart from one another at a first pitch and extending in a first direction;
  forming first hard mask patterns by etching the hard mask layer using the first etch masks;
  forming line spacers on sidewalls of the first mask patterns;
  forming second etch masks on the first hard mask patterns having the line spacers, the second etch masks including a plurality of second line patterns spaced apart from one another at a second pitch and extending in a second direction different from the first direction;
  forming second hard mask patterns by etching the first hard mask patterns using the second etch masks; and
  patterning the etching target layer using the second hard mask patterns.

10. The method as claimed in claim 9, wherein the etching target layer is a polysilicon layer.

11. The method as claimed in claim 9, wherein the line spacers are formed of the same material as the hard mask layer.

12. The method as claimed in claim 9, wherein the line spacers are low-temperature oxide layers.

13. The method as claimed in claim 9, including reducing a line edge roughness of the first hard mask patterns by way of the line spacers.

* * * * *